United States Patent [19]

Wei

[11] Patent Number: 4,641,327
[45] Date of Patent: Feb. 3, 1987

[54] FRAME SYNCHRONIZATION IN TRELLIS-CODED COMMUNICATION SYSTEMS

[75] Inventor: Lee-Fang Wei, Westwood, Mass.
[73] Assignee: Codex Corporation, Mansfield, Mass.
[21] Appl. No.: 753,182
[22] Filed: Jul. 9, 1985
[51] Int. Cl.⁴ .................. H04L 7/04; G06F 11/10
[52] U.S. Cl. ........................ 375/114; 371/43; 375/38
[58] Field of Search .................... 375/13, 34, 38, 39, 375/58, 114, 115, 116, 25, 106; 370/105-107; 371/40, 43, 42, 44, 46; 178/22.04, 22.05

[56] References Cited

U.S. PATENT DOCUMENTS

| | | | |
|---|---|---|---|
| 3,665,396 | 5/1972 | Forney, Jr. | 340/146.1 |
| 3,806,647 | 4/1974 | Dohne et al. | 178/67 |
| 4,032,886 | 6/1977 | En et al. | 340/146.1 |
| 4,291,406 | 9/1981 | Bahl et al. | 371/44 |
| 4,312,070 | 1/1982 | Coombes et al. | 371/40 |
| 4,447,908 | 5/1984 | Chevillat et al. | 375/42 |
| 4,493,082 | 1/1985 | Cumberton et al. | 371/43 |
| 4,527,279 | 7/1985 | Yasuda et al. | 375/114 |
| 4,586,182 | 4/1986 | Gallager | 371/43 |

OTHER PUBLICATIONS

Falconer, "Jointly Adaptive Equalization and Carrier Recovery in Two-Dimensional Digital Communication Systems," Bell System Technical Journal, pp. 317-334, Mar. 1976.

Viterbi and Omura, *Principles of Digital Communication and Coding,* pp. 258-261, 1979.

*Primary Examiner*—Robert L. Griffin
*Assistant Examiner*—M. Huseman

[57] ABSTRACT

Frame synchronization is accomplished in a trellis-coded communication system by causing the sequence of signal points that results when the receiver incorrectly determines the start of each frame to be an impermissible sequence, and detecting the existence of the impermissible sequence by monitoring the rate of occurrence of non-zero difference between the minimum branch metric and the minimum path metric of a maximum likelihood decoding algorithm, such as the Viterbi decoding algorithm. In another aspect, an interleaver and a deinterleaver are used to assure that impermissible sequences result when frame synchronization is lost.

13 Claims, 7 Drawing Figures

FRAME SYNCHRONIZATION IN TRELLIS-CODED COMMUNICATION SYSTEMS

BACKGROUND OF THE INVENTION

This invention relates to maintaining frame synchronization between the receiver and the transmitter in a trellis-coded communication system.

In some trellis-coded communication systems the two-dimensional signal points sent by the transmitter are grouped into frames, and the receiver must be able to identify (i.e. synchronize itself to) the beginning of each frame for proper operation.

In so-called multi-dimensional trellis-coded systems (for example systems of the kind disclosed in Wei, U.S. patent application Ser. No. 727,398, filed Apr. 25, 1985, assigned to the same assignee as this invention, and incorporated herein by reference) the two-dimensional signal points carried on the channel between the transmitter and receiver are organized as multi-dimensional signal points, each multi-dimensional signal point comprising more than one two-dimensional signal point. At the receiver, in order to decode the multi-dimensional signal points, the receiver must be synchronized to identify the first two-dimensional signal point of each multi-dimensional signal point.

In so-called multiplexed communication systems, a high-bit-rate stream of bits to be transmitted is segmented into multiplexing frames. Each frame is built up (multiplexed) based on bits delivered from several ports each serving a relatively low-bit-rate data source. Each frame is transmitted as a group of signal points. At the receiver, in order to demultiplex each such multiplexing frame for delivery to several corresponding ports serving relatively low-bit-rate data sinks, the receiver must be able to locate the beginning of each group of signal points.

SUMMARY OF THE INVENTION

One general feature of the invention is a communication system in which frame synchronization is maintained at the receiver by causing the sequence of signal points that results when the receiver incorrectly determines the start of each frame to be an impermissible sequence of the trellis code, and detecting the existence of the impermissible sequence by monitoring the rate of occurrence of non-zero difference between the minimum path metric and the minimum branch metric associated with a maximum likelihood decoding algorithm (for example the Viterbi algorithm) in the receiver.

Another general feature of the invention is an interleaver that changes the original sequence of signal points to a revised sequence for transmission and a deinterleaver that changes the received sequence of signal points in a manner that will restore the original sequence when the receiver is in frame synchronization, and will otherwise restore an impermissible sequence.

Preferred embodiments include the following features. The communication system is a trellis-coded modulation system. Each signal point is two-dimensional. The two-dimensional points are grouped into multi-dimensional points. Each frame has at least one multi-dimensional point. Each multi-dimensional point is 8 dimensional. The transmitter includes a multiplexer to receive information bits from more than one port and multiplex them such that the information bits are organized into groups corresponding to the frames of signal points, the bits from each port always appearing in the same particular positions in each group. The information bits are transmitted at a rate of Q bits per signaling interval. The bits from a given port do not always occupy the same particular positions in each group of bits transmitted in a signal interval. When the rate of occurrence of non-zero difference between the minimum path metric and the minimum branch metric is greater than a predetermined threshold (e.g., 0.4), a synchronization loss signal is delivered.

The invention permits frame synchronization to be maintained without requiring any additional information to be transmitted. Since both the minimum path metric and the minimum branch metric are easily available in the receiver, frame synchronization can be maintained at almost no cost in system complexity. Frame synchronization information is available immediately at the receiver, and is accurate even under very noisy conditions. In embodiments that use interleaving, the performance of the decoder against correlated noise can also be improved by the interleaving.

Other advantages and features will become apparent from the following description of the preferred embodiment, and from the claims.

DESCRIPTION OF THE PREFERRED EMBODIMENT

We first briefly describe the drawings.

Drawings

STRUCTURE AND OPERATION

Figure 1:
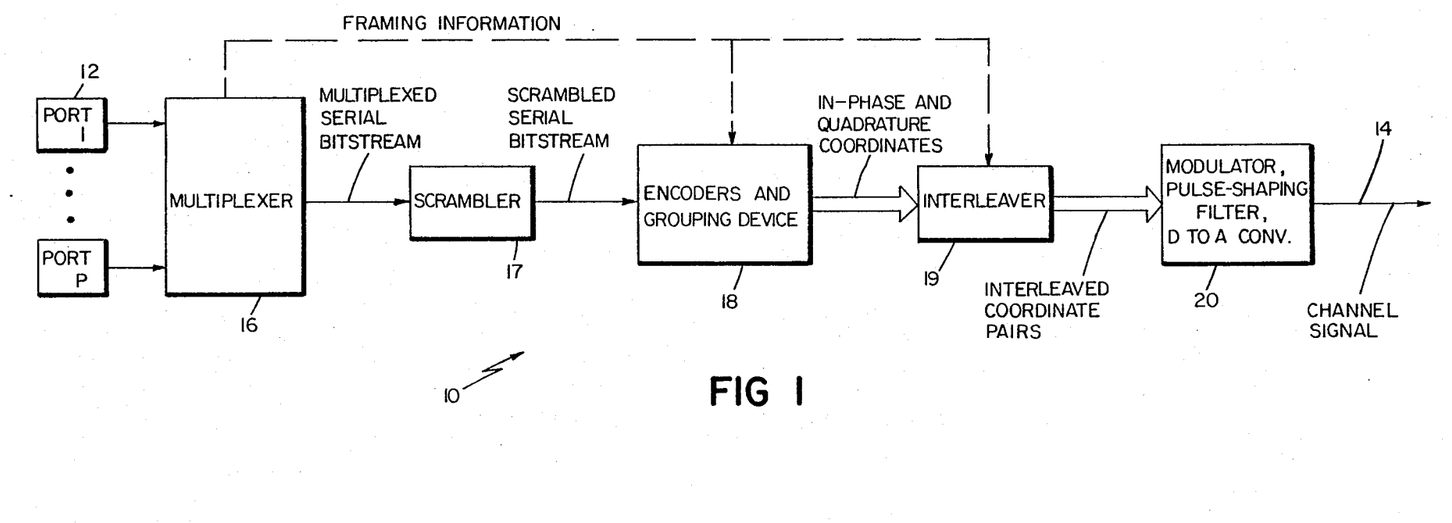
FIG. 1 is a block diagram of a transmitter.

Referring to FIG. 1, in transmitter 10 the bits delivered from each of P different sending ports 12 (for example, P=8) at a rate of Q/P bits per signaling interval (where, for example, Q=7 and each signaling interval is 1/2743 seconds long) are combined in a multiplexer 16 to form a framed multiplexed serial bit stream to be sent over a channel 14. The multiplexed bit stream is scrambled in a scrambler 17 and then delivered to encoders and grouping device 18 at a rate of Q bits per signaling interval (i.e., 7 bits per signaling interval in the present example). Multiplexer 16 also provides side framing information (indicated by dashed lines) to encoders and grouping device 18 and to an interleaver 19. The bits appearing at the input of encoders and grouping device 18 with respect to a given signaling interval, for example, the nth signaling interval, are denoted $II_n$ through $IQ_n$. The side framing information indicates which bits in the multiplexed serial bit stream are the initial bits in the frames of the multiplexed bit stream.

Based on the side framing information and on the information bits appearing with respect to a number N (for example, N=4) of successive signaling intervals (for example the 28 information bits $II_m$ through $IQ_m$, for $m = n, n+1, \ldots, n+3$), the encoders and grouping device 18 deliver to interleaver 19, N pairs of in-phase and quadrature coordinates in series, one pair in each signaling interval, each pair corresponding to a point in a two-dimensional (2D) signal constellation. Interleaver 19 reorders the coordinate pairs based on the side framing information (in a manner to be described below), and delivers them to a modulator 20 to modulate a carrier. The modulated carrier is then pulse-shape filtered, and then D-to-A converted to an analog signal for transmission over channel 14 (as in a conventional Quadrature-Amplitude-Modulated (QAM) carrier system).

Figure 2:
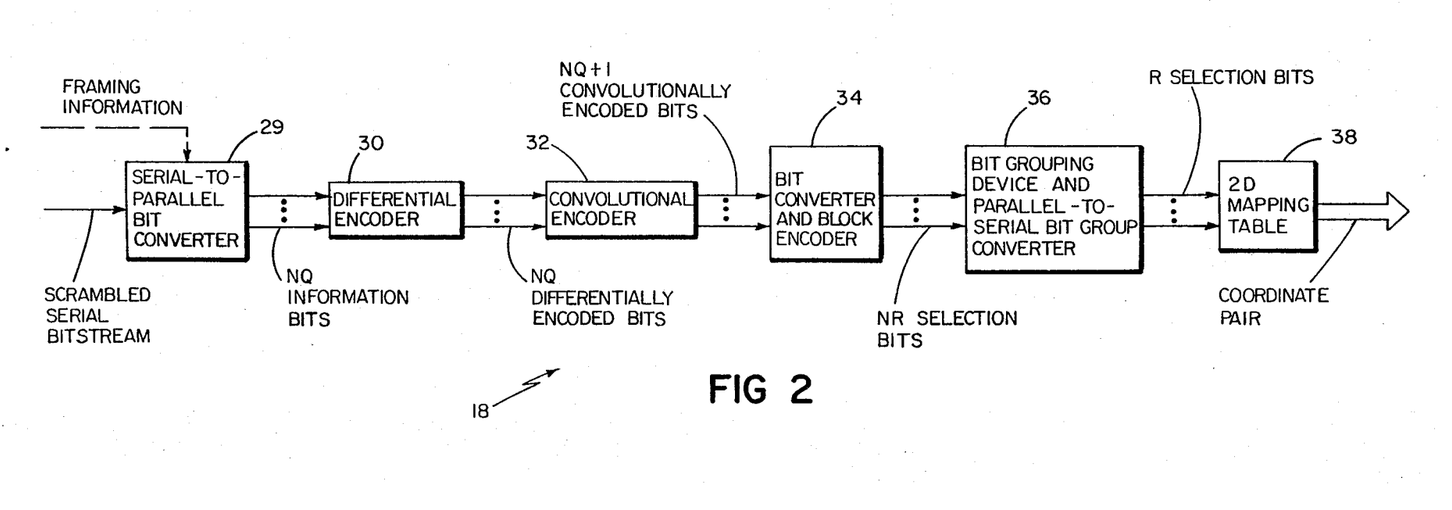
FIG. 2 is a block diagram of the encoders and grouping device of FIG. 1.

Referring to FIG. 2, encoders and grouping device 18 include a serial-to-parallel bit converter 29 which groups the incoming scrambled serial bitstream into blocks of NQ information bits based on the side framing information and sends them in parallel to differential encoder 30. The differentially encoded information bits are then passed through a convolutional encoder 32 which adds one redundant bit indicative of the current state of a finite state device represented by the convolutional encoder. The convolutionally encoded bits are then passed through a bit converter and block encoder 34. The block encoder encodes some of the input bits and adds N−1 additional bits; and the bit converter converts a set of bits into an equal number of bits.

The output bits of the bit converter and block encoder 34 are a set of NR point selection bits, where R is an integer equal to Q+1 (because bits have been added by the convolutional encoder and the block encoder). A bit grouping device and parallel-to-serial bit group converter 36 then organizes the NR coded bits into N groups denoted as $Z0_m$ through $ZQ_m$, m=n,n+1, ..., n+N−1, and delivers one group in each signaling interval to a 2D mapping table 38. For each combination of bits in a group, table 38 contains the corresponding pair of modulation coordinates which are then delivered to interleaver 19 (FIG. 1).

Because the next state of the finite state device represented by the convolutional encoder depends both on its current state and on the current information bits, the output bits of the convolutional encoder (and hence the transmitted signals) carry historical information about the sequence of information which is exploited at the receiver end of channel 14.

Figure 3:
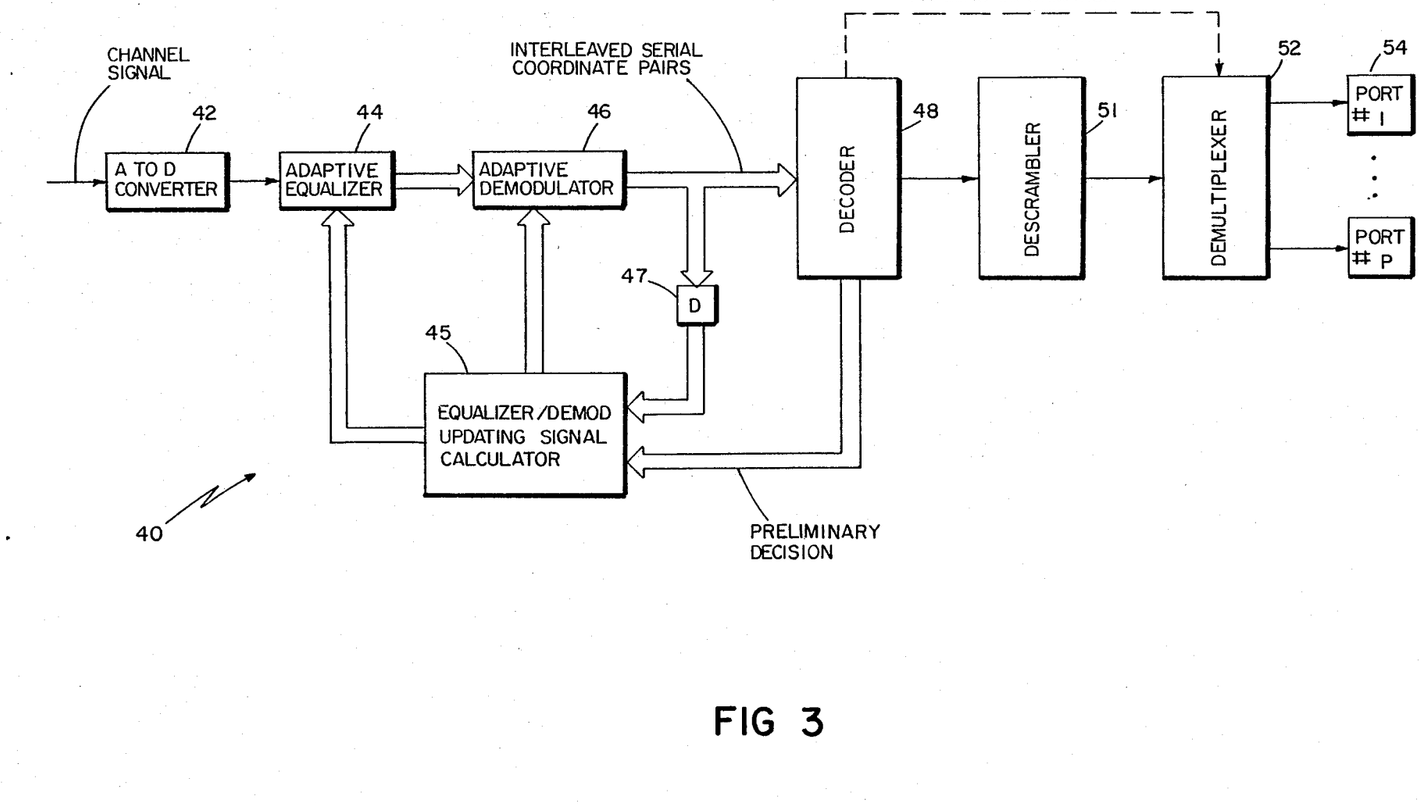
FIG. 3 is a block diagram of a receiver for use with FIG. 1.

Referring to FIG. 3, in receiver 40, the received channel signal is passed through an A-to-D converter 42, an adaptive equalizer 44, and an adaptive demodulator 46. Equalized and demodulated coordinate pairs are delivered serially from demodulator 46 to a decoder 48. Decoder 48 feeds back preliminary decisions on the received coordinate pairs to equalizer/demodulator updating signal calculator 45. These preliminary decisions are processed in calculator 45 in a conventional manner to generate updating signals for the equalizer and demodulator, as disclosed in Falconer, "Jointly Adaptive Equalization and Carrier Recovery in Two-Dimensional Digital Communication Systems", Bell System Technical Journal, pp. 317–334, March, 1976, incorporated herein by reference. The preliminary decisions may be delayed. In that case the demodulator output will be delayed accordingly by delay element 47 before it is sent to calculator 45. Decoder 48 also deinterleaves the coordinate pairs and, after a delay of a number of signaling intervals, delivers to descrambler 51 final decisions of scrambled information bits which were sent. The descrambled bit stream is demultiplexed in demultiplexer 52 (based on side framing information delivered from decoder 48) into P bit streams, one delivered to each output port 54.

Figure 4:
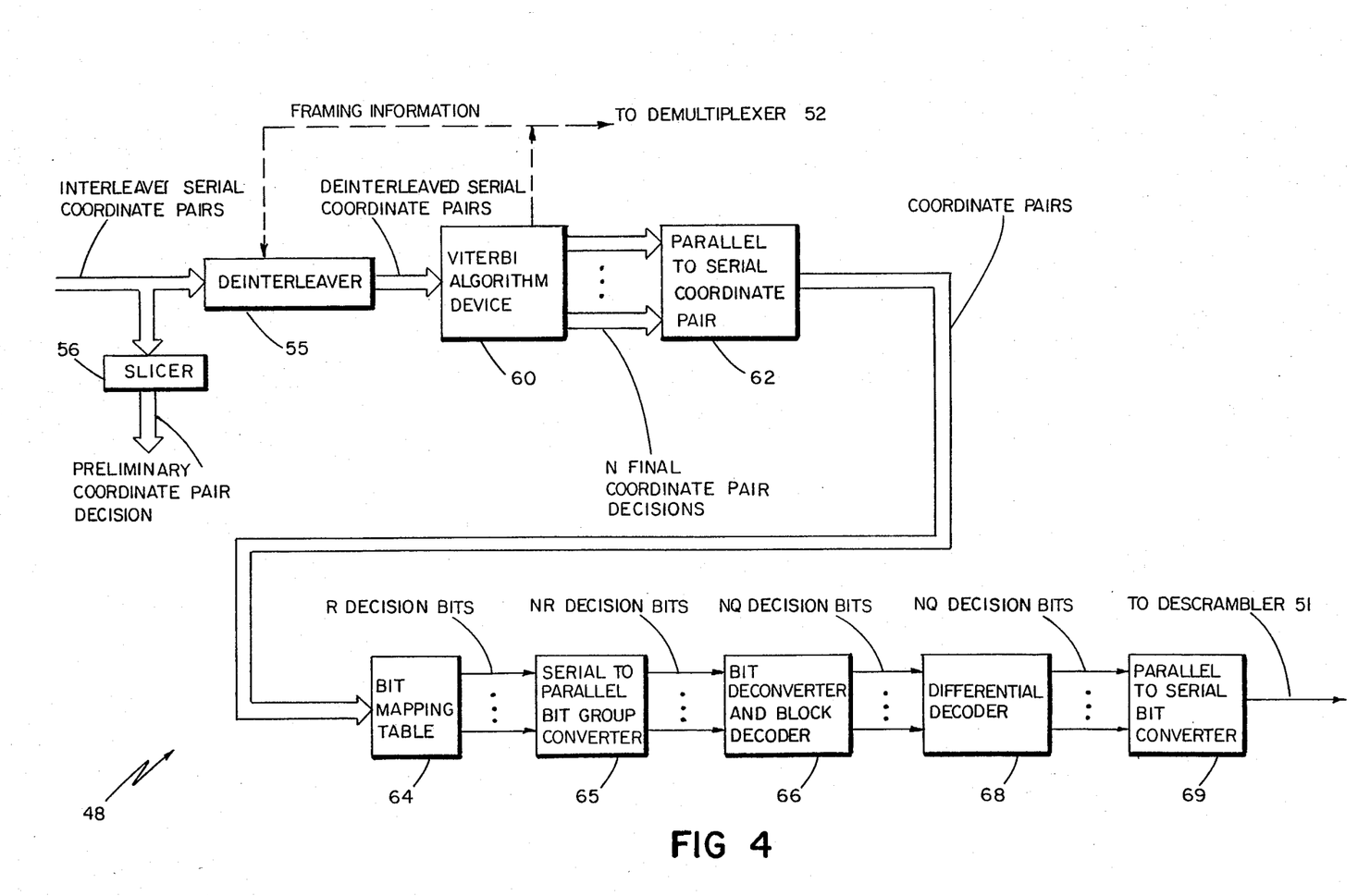
FIG. 4 is a block diagram of the decoder of FIG. 3.

Referring to FIG. 4, in decoder 48 the interleaved serial coordinate pairs are delivered to a deinterleaver 55 which, as long as frame synchronization has not been lost, restores them to their original non-interleaved order, based on side framing information from a Viterbi algorithm device 60. The interleaved serial coordinate pairs are also delivered to a slicer 56 which feeds back the preliminary decisions to equalizer and demodulator 45. The deinterleaved pairs are delivered to Viterbi algorithm device 60 which, after some delay, delivers N final coordinate pair decisions in parallel for every block of N signaling intervals. The Viterbi algorithm device 60 also derives the side framing information in a manner described below and delivers it to deinterleaver 55 and demultiplexer 52. Converter 62 applies one coordinate pair in each signaling interval to a bit mapping table 64. For each block of N coordinate pairs applied to table 64, the corresponding N groups of R decision bits are grouped together in serial-to-parallel bit group converter 65 and delivered to a bit deconverter and block decoder 66 and then to a differential decoder 68. The deconverter and decoder perform reverse conversion and decoding from those performed at the transmitter. A parallel-to-serial bit converter 69 then provides the original scrambled information bitstream to the descrambler 51.

The transmitter and receiver are implemented by programming a microprocessor and signal processors interconnected in the way disclosed in U.S. patent application Ser. No. 586,681, filed Mar. 6, 1984, incorporated herein by reference.

In a preferred embodiment, to send 7 bits per signaling interval using a 64-state, 8D code, as set forth in the Wei patent application, incorporated by reference above, the transmitter takes the 28 information bits which appear at the output of scrambler 17 in each block of four signaling intervals and encodes them into four 2D points (which together define an 8D point) drawn from a 2D constellation having 160 points.

Because there are 8 ports and because 28 is not an integral multiple of 8, it is impossible to arrange for the bits drawn from a given sending port 12 to always appear in the same particular positions in each 28-bit block corresponding to an 8D point. However, by defining a multiplexing frame of 56 bits corresponding to two 28-bit blocks, and by drawing seven bits in turn from each sending port to make up the 56-bit frame, then the bits drawn from a given sending port can always occupy the same particular positions in each frame. By synchronizing receiver 40 to identify the beginning of each multiplexing frame, the demultiplexer can deliver to the corresponding receiving port 54 the bits which appear in those particular positions in each frame.

Figure 5:
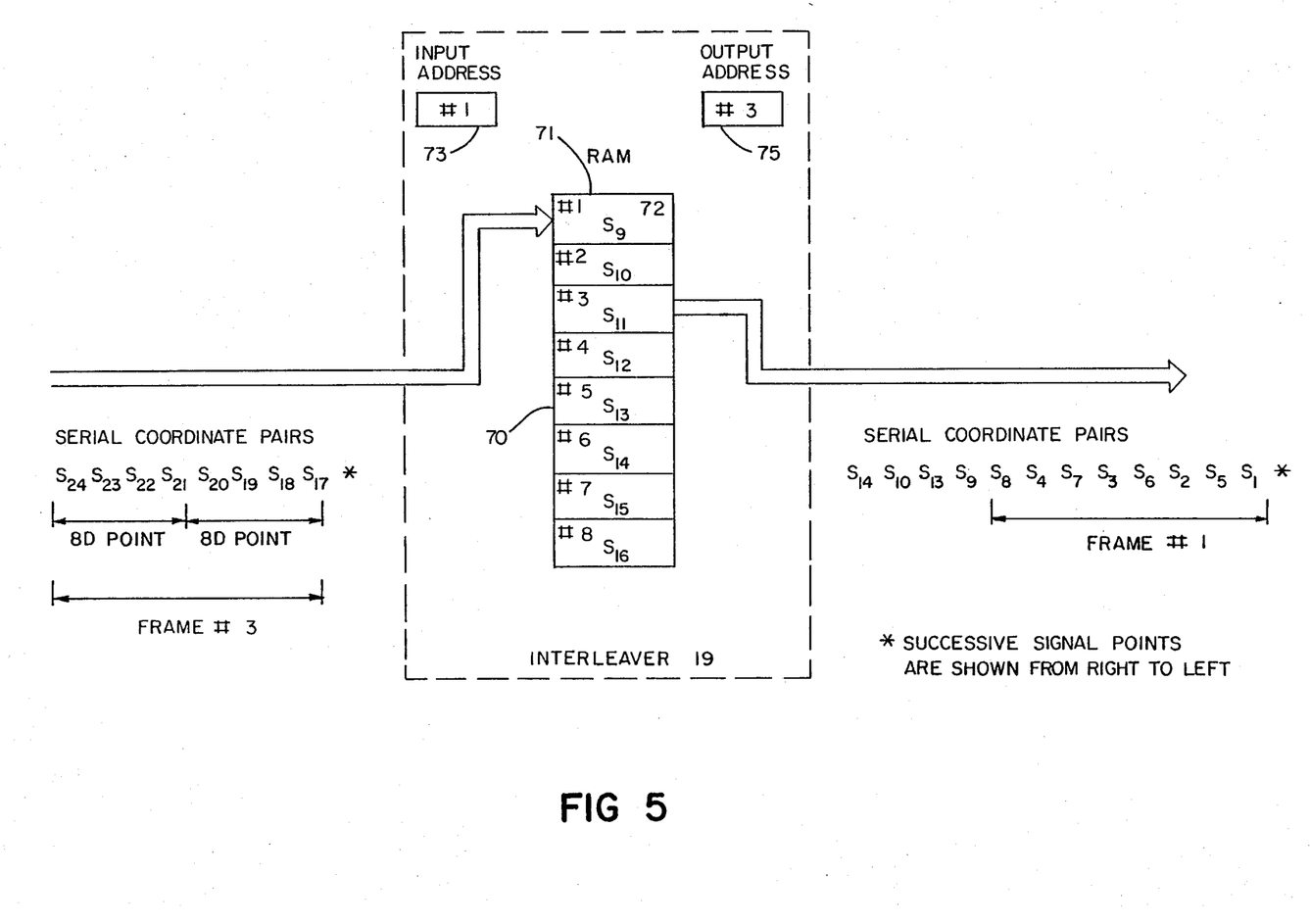
FIG. 5 is a block diagram of the interleaver of FIG. 1.

Referring to FIG. 5, the 2D points delivered by the encoders and grouping device 18 are denoted $S_n$, where n=1, 2, ... is the order of the signaling intervals. Each multiplexing frame comprises eight 2D points (i.e., two 8D points). For example, the first multiplexing frame is made up of $S_1 \ldots S_8$, the second begins with $S_9$, and so on.

In order for the receiver 40 to identify the beginning of each multiplexing frame, interleaver 19 reorders the eight coordinate pairs in each frame as follows. Interleaver 19 has a random access memory (RAM) 70 that comprises eight storage elements 72. Each element can hold one coordinate pair. Each of these eight elements has an address (indicated by reference numeral 71) from #1 through #8. And they can be accessed in a random order. The element being currently written into is determined by the address contained in an input address register 73. And the element being currently read out is determined by the address contained in an output address register 75. The coordinate pairs at the output of the encoders and grouping device 18 are written into the RAM 70 based on a cyclic input address sequence, #1, #2, #3, #4, #5, #6, #7, #8, starting with #1. The coordinate pair $S_1$ is thus written into the storage element #1 in the signaling interval 1. $S_2$ is written into the storage element #2 in the signaling interval 2. $S_9$ is written into the storage element #1 in the signaling interval 9, and so on.

Starting from signaling interval 5, the coordinate pairs are read out of the RAM 70 based on a cyclic output address sequence, #1, #5, #2, #6, #3, #7, #4, #8, starting with #1. The coordinate pair $S_1$ is thus read out of the element #1 in the signaling interval 5. The coordinate pair $S_5$ is read out of the element #5 in the signaling interval 6. The coordinate pair $S_9$ is read out of the element #1 again in the signaling interval 13, and so on. FIG. 5 illustrates the situation at the beginning of signaling interval 17. At that moment, RAM 70 contains the coordinate pairs $S_9$, $S_{10}$, $S_{11}$, $S_{12}$, $S_{13}$, $S_{14}$, $S_{15}$, and $S_{16}$ stored in the elements #1, #2, #3, #4, #5, #6, #7, and #8, respectively. The input address register contains the address #1. The current input coordinate pair $S_{17}$ will be written into the element #1. The coordinate pair $S_9$ currently stored in that element will be erased. The output address register contains the address #3. The coordinate pair $S_{11}$ currently stored in the element #3 will be read out. Also shown in FIG. 5 are the sequence of coordinate pairs that have already been read out of the RAM 70 and the next eight coordinate pairs that are going to be written into the RAM 70 in the next eight signaling intervals. At the end of the signaling interval 17, the RAM 70 contains the coordinate pairs $S_{17}$, $S_{10}$, $S_{11}$, $S_{12}$, $S_{13}$, $S_{14}$, $S_{15}$, and $S_{16}$, stored in the elements #1, #2, #3, #4, #5, #6, #7, and #8, respectively. And the addresses contained in the input and output address registers are respectively updated to #2 and #7 based on the cyclic input and output address sequences mentioned above.

Figure 6:
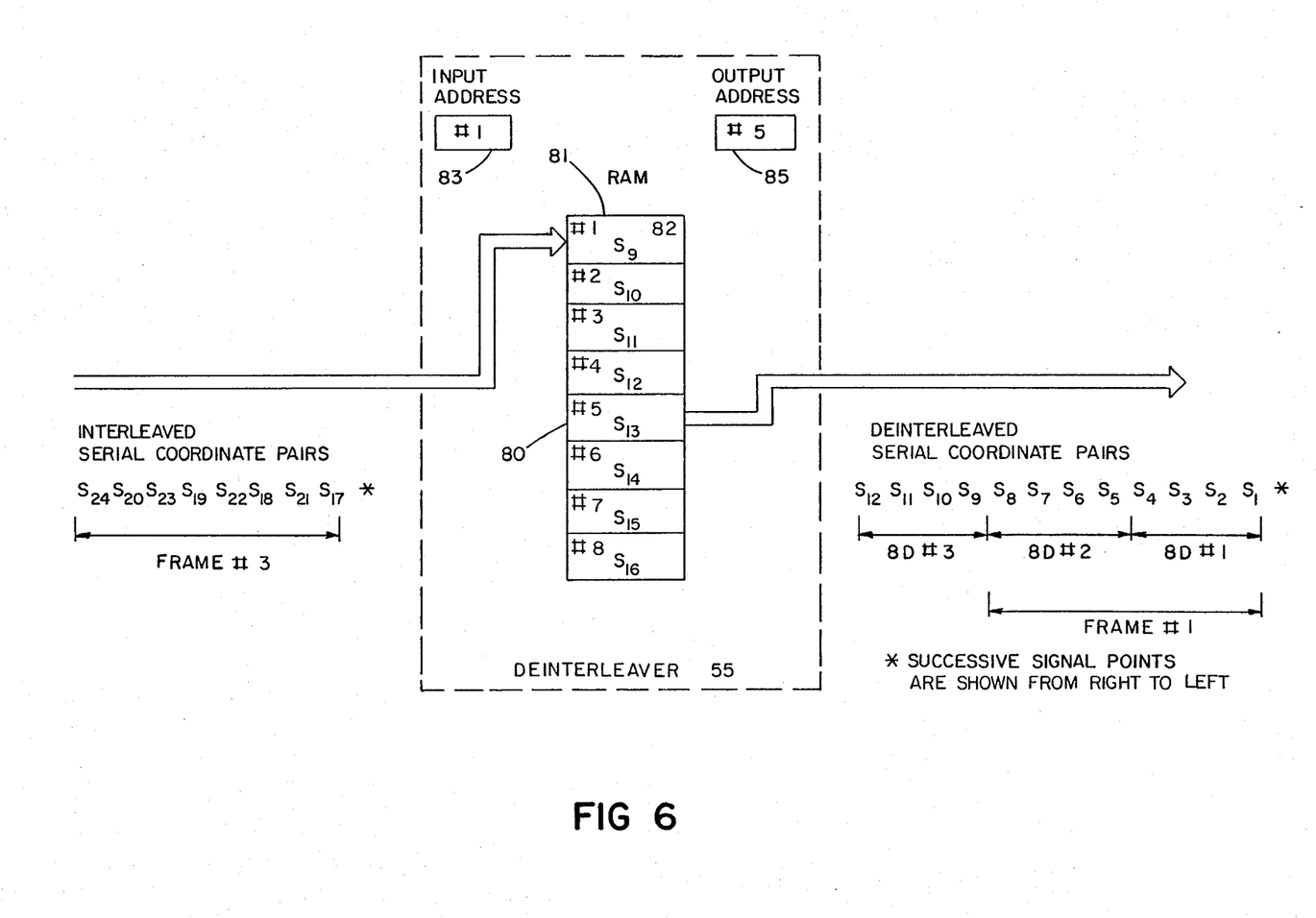
FIG. 6 is a block diagram of the deinterleaver of FIG. 4.

Referring to FIG. 6, at the receiver, deinterleaver 55 reverses the interleaving process to restore the received coordinate pairs into their original order $S_1$, $S_2$, $S_3$, ..., assuming that the receiver knows where the beginning of each multiplexing frame is.

The deinterleaver 55 has a configuration identical to that of the interleaver 19. It has a RAM 80 that comprises eight storage elements 82, an input address register 83, and an output address register 85. The eight elements of the RAM 80 have addresses from #1 though #8 (as indicated by reference numeral 81).

The coordinate pairs at the output of the demodulator 46 are written into the RAM 80 based on a cyclic input address sequence, #1, #5, #2, #6, #3, #7, #4, #8, starting with #1. The first coordinate pair in each received frame of eight coordinate pairs at the output of the demodulator 46 is thus always written into the element #1 when the receiver knows where the beginning of each frame is. For notational convenience, assume that the first received coordinate pair $S_1$ is written into the element #1 in the signaling interval 1 of the receiver. Note that there may be a delay in the signaling interval 1 of the receiver as compared to that of the transmitter because of the propagation time and the processing time that elapses ahead of decoder 48. Starting from the signaling interval 5 of the receiver, the coordinate pairs are read out of the RAM 80 based on a cyclic output address sequence #1, #2, #3, #4, #5, #6, #7, #8, starting with #1. The coordinate pair $S_1$ is thus read out of the element #1 in the signaling interval 5 of the receiver. The coordinate pair $S_2$ is read out of the element #2 in the signaling interval 6. The coordinate pair $S_9$ is read out of the element #1 again in the signaling interval 13, and so on. FIG. 6 illustrates the situation at the beginning of the signaling interval 17 of the receiver. At that moment, the RAM 80 contains the coordinate pairs $S_9$, $S_{10}$, $S_{11}$, $S_{12}$, $S_{13}$, $S_{14}$, $S_{15}$, and $S_{16}$ stored in the elements #1, #2, #3, #4, #5, #6, #7, and #8, respectively. The input address register contains the address #1. The current input coordinate pair $S_{17}$ will be written into the element #1. The coordinate pair $S_9$ currently stored in the element #1 will be erased. The output address register contains the address #5. The coordinate pair $S_{13}$ currently stored in the element #5 is going to be read out. Also shown in FIG. 6 are the sequence of coordinate pairs that have already been read out of the RAM 80, and the next eight coordinate pairs that are going to be written into RAM 80 in the next eight signaling intervals.

At the end of signaling interval 17, RAM 80 contains the coordinate pairs $S_{17}$, $S_{10}$, $S_{11}$, $S_{12}$, $S_{13}$, $S_{14}$, $S_{15}$, and $S_{16}$, stored in the elements #1, #2, #3, #4, #5, #6, #7, and #8, respectively. The addresses contained in the input and output address registers are respectively updated to #5 and #6 based on the last mentioned cyclic input and output address sequences.

Figure 7:
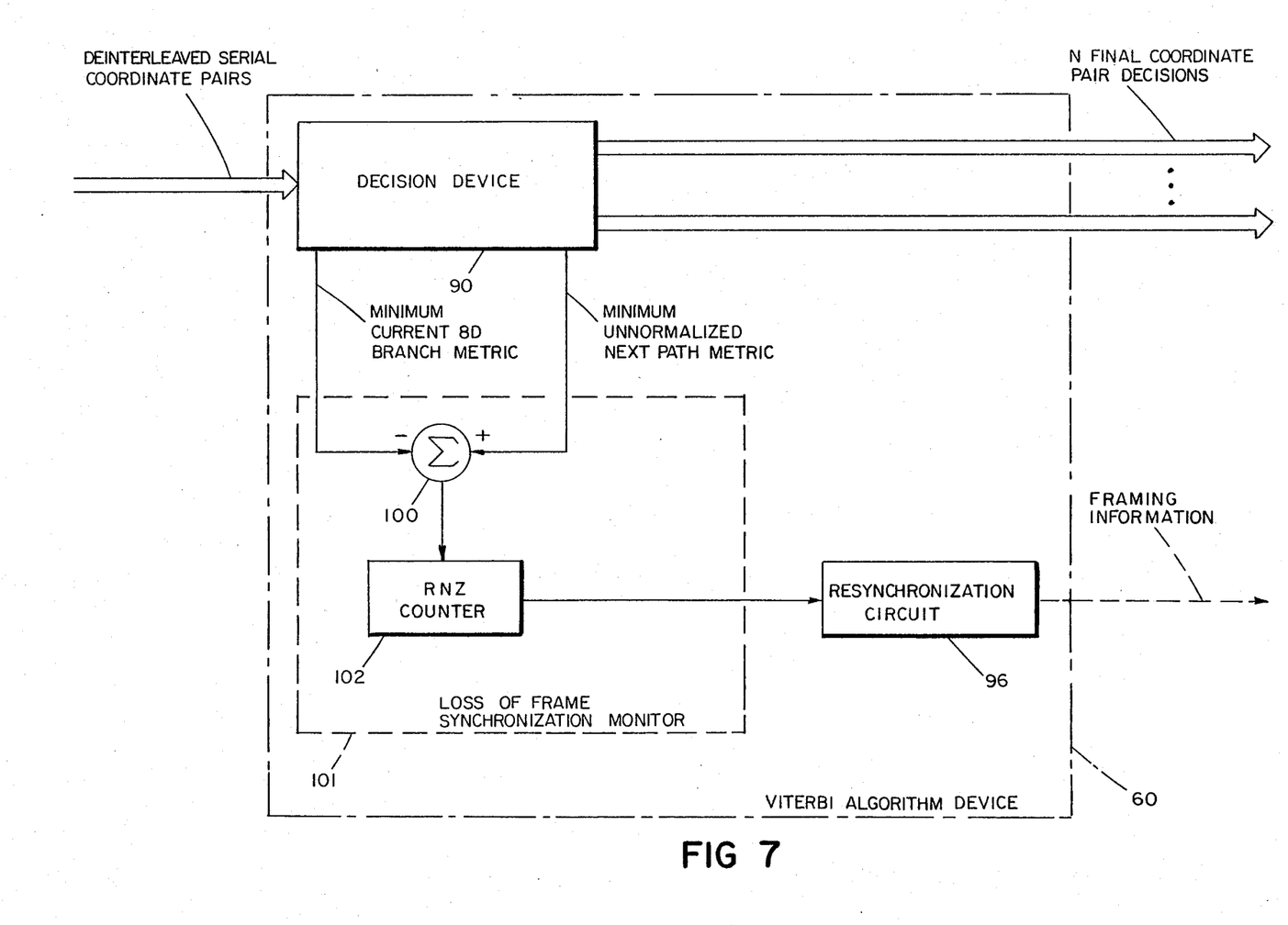
FIG. 7 is a block diagram of the Viterbi algorithm device of FIG. 4.

Referring to FIG. 7, Viterbi algorithm device 60 includes a decision device 90 that uses the Viterbi algorithm and the incoming stream of deinterleaved serial coordinate pairs to decide which coordinate pairs were sent. The coordinate pair decisions are delivered (after some delay) to converter 62 (FIG. 4). Decision device 90 operates in a manner disclosed in the Wei application (incorporated by reference above). In order to identify the beginning of each multiplexing frame, device 90, in the course of its operation with respect to each received 8D point, also generates the minimum current 8D branch metric that represents the squared Euclidean distance between the received 8D point and the nearest 8D point in the 8D constellation.

In extending the trellis paths in the decision device 90, each of the 64 current states of the trellis code is associated with a current path metric. These current path metrics are normalized. That is, the minimum of these current path metrics is zero. For each received 8D point, these current path metrics are updated as follows. For each of the 64 next states, a sum is formed for each transition from a current state leading to that next state by adding the associated current path metric and the associated 8D branch metric. These sums are compared and the smallest sum becomes the unnormalized next path metric associated with that next state. The minimum of the 64 unnormalized next path metrics is then determined and delivered to loss of frame synchronization monitor 101. This minimum unnormalized next path metric is also used in the decision device 90 to normalize the next path metric associated with each next state. These normalized next path metrics will then be referred to as the current path metrics for the next received 8D point. The minimum unnormalized next path metric represents the squared Euclidean distance between the received sequence of coordinate pairs and the nearest permissible sequence of 8D points through the trellis.

The loss of frame synchronization monitor 101 receives the current minimum 8D branch metric and the minimum unnormalized next path metric, and, based on them, detects if frame synchronization has been lost. If loss is detected, a loss signal is sent to a resynchronization circuit 96. When the circuit 96 receives the loss signal, it tells the deinterleaver 55 and the demultiplexer 52 to shift backward (or forward) one 2D point in the positions that are treated as the beginnings of the frames. This shifting process is repeated until no loss signal is received. Since there are eight 2D points in each frame, the process will be repeated at most seven times. Alternatively if a reverse channel from the receiver to the transmitter is available, the circuit 96 can instruct the transmitter to send a known sequence of signal points to reestablish the frame synchronization.

Monitor 101 includes a subtracter 100 that forms the difference between the current minimum 8D branch metric and the minimum unnormalized next path metric. This difference is sent to an RNZ counter 102. Various ways can be used in the RNZ counter 102 to count the rate of occurrence of nonzero difference. One method is described below. RNZ counter 102 is reinitialized to zero at the beginning of each successive block of 100 8D points, and calculates the proportion of 8D points in each block for which a non-zero difference has occurred. It does this by counting the number of nonzero differences from subtracter 100 and dividing the count by 100. If this proportion, called RNZ, is greater than 0.4 for three successive blocks of 100 8D points, RNZ counter 102 issues the loss signal to circuit 96.

That the frame synchronization can be maintained by monitoring the RNZ can be seen as follows. When the receiver loses frame synchronization, it slips backward (or forward) one or more 2D points in the position that it treats as the beginning of the frame. For example, if it slips backward by one 2D point, it would erroneously determine that the first and second frames at the input of the deinterleaver 55 as being made up of the following 2D points (assuming, for ease of discussion, that the received points are not noise altered):

First Frame
$S_5 S_2 S_6 S_3 \quad S_7 S_4 S_8 S_9$
Second Frame
$S_{13} S_{10} S_{14} S_{11} \quad S_{15} S_{12} S_{16} S_{17}$ (Successive signal points are shown from left to right.) The deinterleaver 55 would then deliver the following deinterleaved series of 2D points (or sequence of 8D points) to the Viterbi algorithm device 60:

First Frame

| $S_5 S_6 S_7 S_8$ | $S_2 S_3 S_4 S_9$ |
|---|---|
| 8D point #1 | 8D point #2 |

Second Frame

| $S_{13} S_{14} S_{15} S_{16}$ | $S_{10} S_{11} S_{12} S_{17}$ |
|---|---|
| 8D point #3 | 8D point #4 |

(Successive signal points are shown from left to right.)

This sequence of 8D points is different from the original sequence at the transmitter, and from any shifted version of the original sequence. The sequence is also not a permissible sequence of the trellis code. This is also the case when the receiver slips backward by two, three, ..., or seven 2D points, which, together with one 2D-point slip, cover all the possible slips.

In the case where the sequence of received 8D points input to the Viterbi algorithm device 60 (assuming the removal of the noise component from each received 8D point) is not a permissible sequence of the trellis code, the probability that the 8D point, closest to the current received noise-altered 8D point and corresponding to the minimum current 8D branch metric, is not associated with a transition from the current state with the minimum current path metric is exactly one-half, because each 8D point is associated with transitions from exactly half of the 64 states of the trellis code. This probability is the same as the rate RNZ at which nonzero difference occurs between the minimum current 8D branch metric and the minimum unnormalized next path metric.

By contrast, when frame synchronization has not been lost, the minimum 8D branch metric corresponds to the preliminary decision at the output of slicer 56. If the output of subtracter 100 is not zero, it implies that either the current preliminary decision or at least one of the recent past preliminary decisions is wrong. Thus the value RNZ corresponds to the symbol error rate of preliminary decisions (SER). In fact the RNZ has been shown by simulation to be smaller than the SER, and SER is only 0.3 even when the corresponding block error rate of final decisions (each block comprises 36 8D-points) is approximately 0.2. Therefore, the values of RNZ when frame synchronization is and is not lost, respectively, are well separated on opposite sides of the 0.4 threshold used by counter 102.

Without the interleaver 19 and deinterleaver 55, the sequence of 8D points input to the Viterbi algorithm device 60 would be a shifted version of the transmitted sequence and thus would be a permissible sequence of the trellis code when the receiver slips four 2D points, a condition which could not be detected by monitoring the Viterbi algorithm device 60. And the demultiplexer then could not function properly.

Among the advantages of the invention are the following. No additional bit is transmitted for frame synchronization. Since both the minimum 8D branch metric and the minimum unnormalized path metric are easily available in the receiver, it is simple to acquire the framing information. Both the minimum 8D branch metric and the minimum unnormalized path metric are available once the receiver starts. The framing information is thus immediately available. The invention works even when the transmission medium is very noisy. The interleaver can further enhance the performance of the trellis code when the noise components contained in the sequence of received signal points are correlated.

Other embodiments are within the following claims.

For example, any type of interleaver can be used to interleave the 2D points at the output of the encoders and grouping device 18 as long as the following statement is valid. When the receiver fails to identify the beginning of each multiplexing frame, the sequence of 8D points obtained at the output of the corresponding deinterleaver is no longer a permissible sequence of the trellis code.

Interleaving is not required in systems where loss of frame synchronization causes resulting sequences of signal points to be invalid under the code.

The invention can be used with 2D trellis-coded systems that have a multiplexed framing structure, or with multi-dimensional trellis-coded systems that are other than the 64-state, 8D code, or with multi-dimensional systems in which the original bit stream is not multiplexed.

The ports served by the system can respectively operate at different bit rates.

I claim:

1. Apparatus for maintaining frame synchronization in a communication system comprising
    a transmitter that sends a sequence of signal points in successive time intervals, said signal points being drawn from a constellation of available signal points such that said sequence is one of a set of permissible sequences that is smaller than the set of all possible sequences of said signal points, said sequence of signal points being organized as a series of frames, each frame beginning at a predetermined time, and
    a receiver that determines said predetermined time when each said frame begins in order to maintain frame synchronization with said transmitter, said receiver comprising
        a decision device for determining said sequence of signal points which were sent by determining the minimum next path metric based on current path metrics and current branch metrics, and
        means for detecting and monitoring the rate of occurrence of non-zero difference between said minimum next path metric and the minimum of said current branch metrics as an indication of loss of frame synchronization.

2. The apparatus of claim 1 wherein said apparatus further comprises
    an interleaver for changing the original said sequence of signal points to a revised sequence for transmission, and
    a deinterleaver for changing the received sequence of signal points in a manner that will restore said original sequence when said receiver is in frame synchronization with said transmitter, and will restore a sequence not within said set of permissible sequences when frame synchronization has been lost.

3. Apparatus for maintaining frame synchronization in a communication system comprising
    a transmitter that sends a sequence of signal points in successive time intervals, said signal points being drawn from a constellation of available signal points such that said sequence is one of a set of permissible sequences that is smaller than the set of all possible sequences of said signal points, said sequence of signal points being organized as a series of frames, each frame beginning at a predetermined time,
    a receiver that determines said predetermined time when each said frame begins in order to maintain frame synchronization with said transmitter,
    an interleaver for changing the original said sequence of signal points to a revised sequence for transmission,
    a deinterleaver for changing the received sequence of signal points in a manner that will restore said original sequence when said receiver is in frame synchronization with said transmitter, and will restore a sequence not within said set of permissible sequences when frame synchronization has been lost, and
    means for detecting that said sequence of signal points is not within said set of permissible sequences as an indication that synchronization has been lost.

4. The apparatus of claim 3 wherein said means for detecting comprises
    a decision device for determining said sequence of signal points which were sent, by determining the minimum next path metric based on current path metrics and current branch metrics, and
    means for detecting and monitoring the rate of occurrence of non-zero difference between said minimum next path metric and the minimum of said current branch metrics as an indication of loss of frame synchronization.

5. The apparatus of claim 1 or 3 wherein said communication system comprises a trellis-coded modulation system.

6. The apparatus of claim 1 or 3 wherein said communication system is a multi-dimensional, trellis-coded modulation system, each said signal point is a two-dimensional signal point, said two-dimensional signal points are grouped into multi-dimensional signal points, and each said frame comprises at least one said multi-dimensional signal point.

7. The apparatus of claim 6 wherein each said multi-dimensional signal point is 8 dimensional.

8. The apparatus of claim 7 wherein each said frame comprises two 8-dimensional points.

9. The apparatus of claim 1 or 3 wherein
    said sequence of signal points corresponds to a stream of information bits to be transmitted, and
    said transmitter includes multiplexer means to receive said information bits from a plurality of ports,
    said information bits are organized into groups corresponding to said frames of signal points, the bits from each given said port always appearing in the same particular positions in each said group.

10. The apparatus of claim 9 wherein
    said information bits are transmitted at a rate of Q bits per signaling interval,
    and wherein the bits from a given said port do not occupy the same particular positions in groups of Q bits transmitted in said signaling intervals.

11. The apparatus of claim 10 wherein
    there are eight said ports,
    Q is 7, and
    each said frame comprises 56 said bits.

12. The apparatus of claim 1 or 4 wherein said detecting and monitoring means deliver a synchronization loss signal when said rate of occurrence of non-zero difference with respect to a plurality of said time intervals is greater than a predetermined threshold.

13. The apparatus of claim 12 wherein said predetermined threshold is 0.4.

* * * * *